United States Patent
Yatskov et al.

(10) Patent No.: US 10,872,838 B1
(45) Date of Patent: Dec. 22, 2020

(54) LID FOR SEMICONDUCTOR ELECTRONIC PACKAGE

(71) Applicant: Juniper Networks, Inc., Sunnyvale, CA (US)

(72) Inventors: Alexander I. Yatskov, Manteca, CA (US); Gautam Ganguly, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 16/836,026

(22) Filed: Mar. 31, 2020

Related U.S. Application Data

(63) Continuation of application No. 15/848,627, filed on Dec. 20, 2017, now Pat. No. 10,643,920.

(60) Provisional application No. 62/476,502, filed on Mar. 24, 2017.

(51) Int. Cl.
*H01L 23/367* (2006.01)
*H01L 25/18* (2006.01)
*H01L 25/065* (2006.01)
*H01L 21/48* (2006.01)
*H01L 23/42* (2006.01)
*H01L 25/00* (2006.01)

(52) U.S. Cl.
CPC ...... *H01L 23/3675* (2013.01); *H01L 21/4878* (2013.01); *H01L 21/4882* (2013.01); *H01L 23/3672* (2013.01); *H01L 23/42* (2013.01); *H01L 25/0652* (2013.01); *H01L 25/0655* (2013.01); *H01L 25/18* (2013.01); *H01L 25/50* (2013.01)

(58) Field of Classification Search
CPC ............... H01L 25/0655; H01L 23/367; H01L 23/538–5386; H01L 23/405; H01L 21/4878; H01L 21/4882
See application file for complete search history.

(56) References Cited

U.S. PATENT DOCUMENTS

| | | | | |
|---|---|---|---|---|
| 5,909,057 A | * | 6/1999 | McCormick | .......... H01L 21/563 257/680 |
| 8,786,075 B1 | * | 7/2014 | Miks | .................... H01L 23/3675 257/704 |
| 10,643,920 B1 | | 5/2020 | Yatskov et al. | |

(Continued)

OTHER PUBLICATIONS

Prosecution History from U.S. Appl. No. 15/848,627, dated Aug. 31, 2018 through Jan. 10, 2020, 93 pp.

*Primary Examiner* — Errol V Fernandes
*Assistant Examiner* — Jeremy J Joy
(74) *Attorney, Agent, or Firm* — Shumaker & Sieffert, P.A.

(57) ABSTRACT

Techniques are described to limit heat transfer from a first electronic component to a second electronic such as by having an aperture in a lid over the second electronic component to form a gap in the conductance of heat from the first electronic component to the second electronic component. A semiconductor electronic package includes a substrate, a first electronic component that is of a first type and that is mounted along a surface of the substrate, a second electronic component that is of a second type different than the first type and that is mounted along the surface of the substrate, and a metallic component that is positioned over the first electronic component and that has an aperture through which the second electronic component is exposed.

20 Claims, 11 Drawing Sheets

(56) References Cited

U.S. PATENT DOCUMENTS

| | | | |
|---|---|---|---|
| 2008/0211088 A1* | 9/2008 | Sato | H01L 23/36 |
| | | | 257/717 |
| 2013/0043581 A1* | 2/2013 | Negoro | H01L 23/36 |
| | | | 257/712 |
| 2013/0161702 A1* | 6/2013 | Chen | B81C 1/00246 |
| | | | 257/254 |
| 2014/0239482 A1* | 8/2014 | Kourakata | H01L 25/0655 |
| | | | 257/712 |
| 2014/0252645 A1 | 9/2014 | Kim et al. | |
| 2014/0346661 A1* | 11/2014 | Liu | H01L 21/4882 |
| | | | 257/713 |
| 2015/0035134 A1* | 2/2015 | Hung | H01L 24/32 |
| | | | 257/712 |
| 2015/0035135 A1* | 2/2015 | Hung | H01L 23/36 |
| | | | 257/712 |
| 2015/0108628 A1 | 4/2015 | Yu et al. | |
| 2015/0162307 A1* | 6/2015 | Chen | H01L 21/56 |
| | | | 257/712 |
| 2015/0262904 A1* | 9/2015 | Hung | H01L 25/105 |
| | | | 257/713 |
| 2016/0157359 A1* | 6/2016 | Arvelo | H05K 3/30 |
| | | | 29/832 |

\* cited by examiner

LID FOR SEMICONDUCTOR ELECTRONIC PACKAGE

This application is a continuation of U.S. application Ser. No. 15/848,627, filed 20 Dec. 2017 which claims the benefit of U.S. Provisional Application Ser. No. 62/476,502, filed 24 Mar. 2017 and entitled LID FOR SEMICONDUCTOR ELECTRONIC PACKAGE, the entire contents of both of which are hereby incorporated by reference.

TECHNICAL FIELD

Aspects of the present disclosure relate to semiconductor electronic package design.

BACKGROUND

An HBM (High-Bandwidth Memory) chip an ASIC (Application-Specific Integrated Circuit) chip may be populated on an interposer and positioned immediately adjacent to one another on the interposer. Positioning the HBM and ASIC immediately adjacent to one another on the interposer may allow for read/write operations for example to be performed at relatively high speeds.

SUMMARY

The present disclosure is directed to techniques for thermally decoupling discrete semiconductor chips that are mounted to a substrate of a semiconductor electronic package, while structural integrity of the semiconductor electronic package is simultaneously maintained or maximized. In general, such techniques may be implemented or realized as any one of a semiconductor electronic package or a method for fabricating the same.

As an example, a semiconductor electronic package may include a substrate, a first electronic component that is of a first type and that is mounted along a surface of the substrate, a second electronic component that is of a second type different than the first type and that is mounted along the surface of the substrate, and a metallic component that is positioned over the first electronic component and that has an aperture through which the second electronic component is exposed.

As another example, a method may include mounting a metallic component to a semiconductor electronic package, that includes a first electronic component and a second electronic component that is of a type different than the first electronic component, so that the first electronic component is covered by the metallic component and the second electronic component is exposed through an aperture of the metallic component.

As another example, a semiconductor electronic package may include at least one electronic component that is of a first type, at least one electronic component that is of a second type different than the first type, and a metallic lid that is positioned to cover the first electronic component, the metallic lid having an aperture to expose the second electronic component.

The details of one or more examples of the disclosure are set forth in the accompanying drawings and the description below. Other features, objects, and advantages of the disclosure will be apparent from the description and drawings, and from the claims.

DETAILED DESCRIPTION

According to an aspect of the present disclosure, an HBM (High-Bandwidth Memory) chip is mounted to an interposer of a semiconductor electronic package immediately adjacent to an ASIC (Application-Specific Integrated Circuit) chip. A lid of the semiconductor electronic package is mounted over the ASIC chip not only so that a surface of the lid is in close thermal contact with a surface of the ASIC chip, but also so that a surface of the HBM chip is exposed through an aperture that extends through the lid. Advantageously, the lid, which includes the aperture, may thus serve as a heat spreader for the ASIC chip and at the same time be substantially thermally decoupled from the HBM chip, so that heat generated by the ASIC chip is almost completely prevented from being transferred to the HBM chip during operation. In this way, thermal limits of the HBM chip, which may be substantially less in magnitude than thermal limits of the ASIC chip, may be observed during operation. Additionally, the lid may serve as a stiffener whereby structural integrity of the package is maintained or maximized due to the size and location of the aperture.

Figure 1:
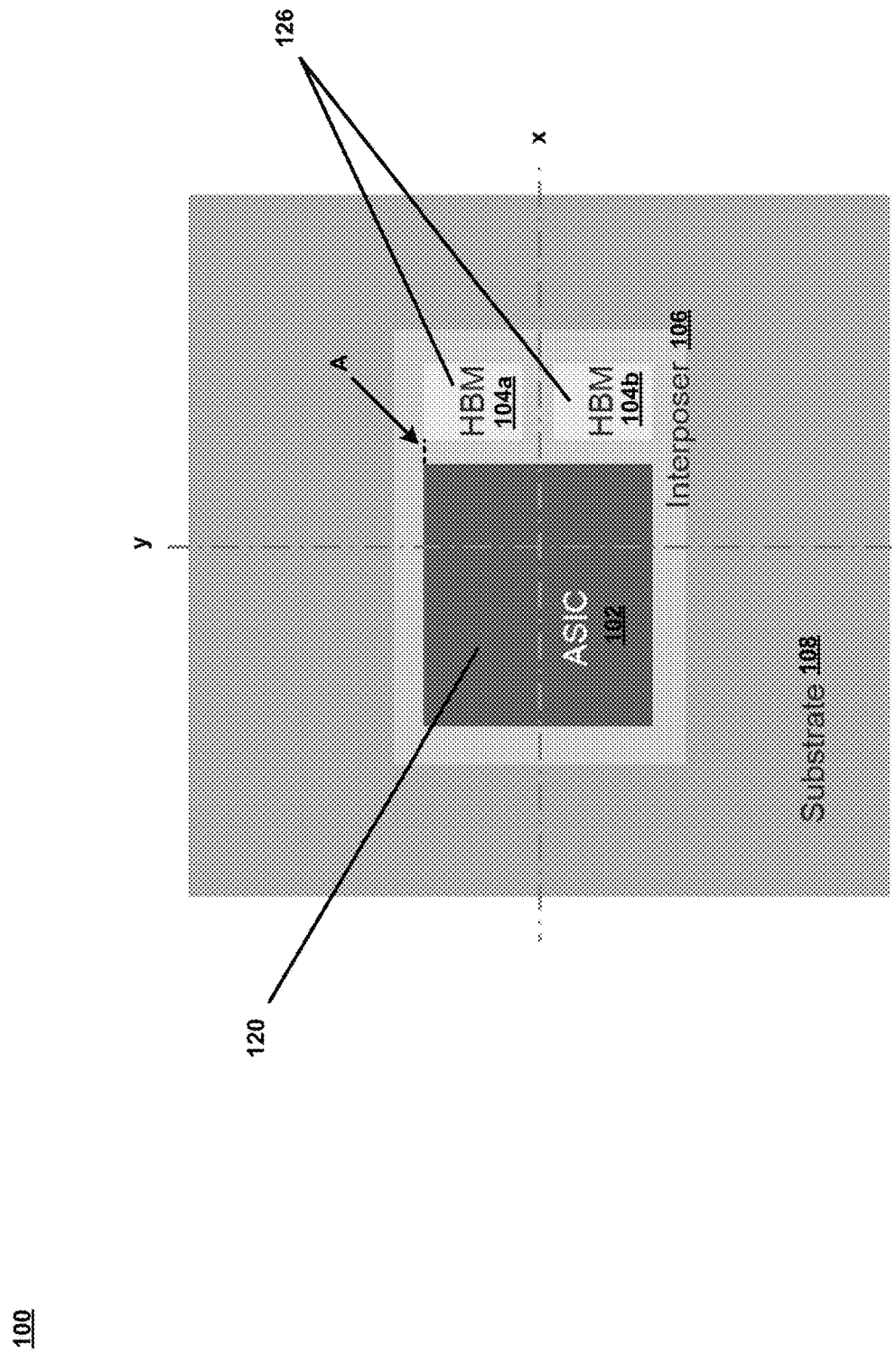
FIG. 1 shows a semiconductor electronic package according to the disclosure.
Figure 2:
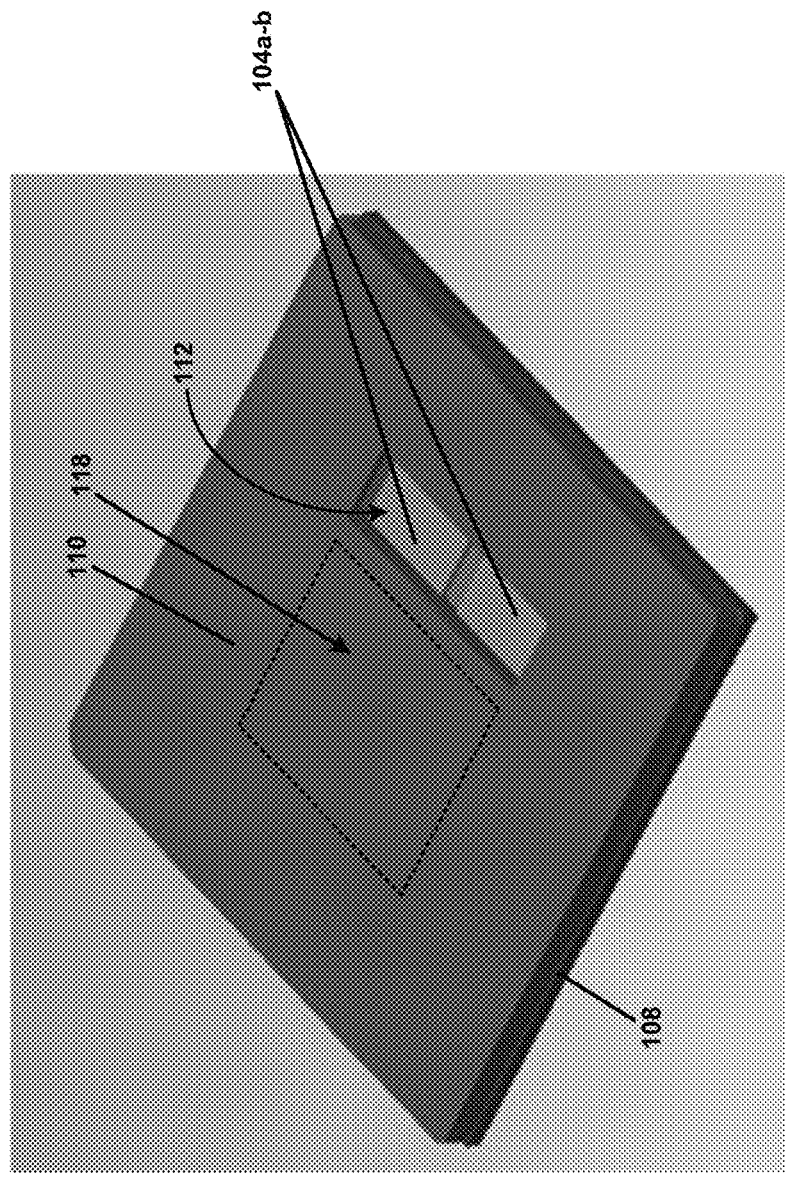
FIG. 2 shows one example of the package of FIG. 1.

FIGS. 1-5 show examples of semiconductor electronic packages according to the disclosure. As illustrated in FIG. 1, package 100 includes ASIC chip 102 and HBM chips 104a-b. HBM chips 104a-b are each mounted to interposer 106, which is in turn mounted to printed circuit board 108. As illustrated in FIG. 2, ASIC chip 102, HBM chips 104a-b, interposer 106, and printed circuit board 108 are covered by lid 110. For example, interposer 106 is mounted to printed circuit board 108, and lid 110 is mounted over interposer 106 to cover ASIC chip 102.

In one or more examples described in this disclosure, lid 110 includes aperture 112 that extends therethrough. The location of aperture 112 in FIG. 2 is one example location, and may be based on the location of HBM chips 104a-b. For example, aperture 112 is located on or within lid 110 such that a surface of each one of HBM chips 104a-b is completely exposed through aperture 112 when lid 110 is mounted over interposer 106 to cover ASIC chip 102. As described in more detail, aperture 112 may ensure that heat generated by ASIC chip 102 during operation is not transferred to HBM chips 104a-b. The temperature at which HBM chips 104a-b operate less efficiently or begin to fault may be lower than the temperature at which ASIC chip 102 operates less efficiently or begins to fault. Accordingly, increase in the temperature of ASIC chip 102 over a threshold temperature may not impact operation of ASIC chip 102. However, if the heat from ASIC chip 102 transfers to HBM chips 104a-b, and thereby causing the temperature of HBM chips 104a-b to increase over the threshold temperature, HBM chips 104*a-b* may operate less efficiently or may fault. With lid 110 including aperture 112, heat transfer from ASIC chip 102 to HBM chips 104*a-b* may be limited, thereby increasing the chances that the temperature of HBM chips 104*a-b* does not increase over the threshold temperature.

Figure 3:
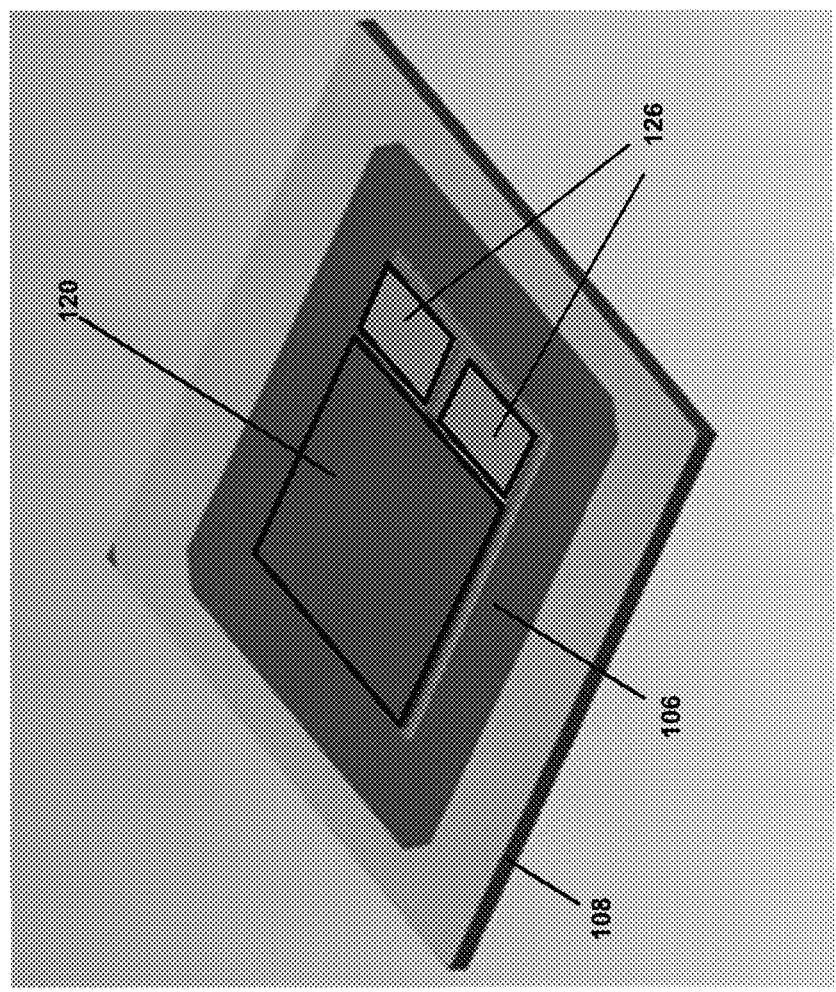
FIG. 3 shows one example of the package of FIG. 1.

As illustrated with dashed lines in FIG. 2, when lid 110 is mounted over interposer 106 to cover ASIC chip 102, a top surface of ASIC chip 102 is in close thermal contact with underside surface 118 of lid 110. FIG. 3 illustrates thermal interface material 120 deposited or otherwise coupled to the top of ASIC chip 102. The close thermal content of ASIC chip 102 with underside surface 118 of lid 110 may be via thermal interface material 120 that covers a surface of ASIC chip 102. Thermal interface material 120 may be various types of materials inserted between ASIC chip 102 and underside surface 118 of lid 108, and may enhance the thermal coupling between ASIC chip 102 and underside surface 118. Examples of thermal interface material 120 may be a so-called thermal grease such as polymerizable liquid matrix. Example matrix materials include epoxies, silicones, urethanes, and acrylates. Thermal grease, polymerizable liquid matrix, and the matrix materials are merely provided as examples and should not be considered limiting. Other types of thermal interface materials are possible such as a phase change material, or a graphite or any other material that would facilitate heat transfer.

Figure 4:
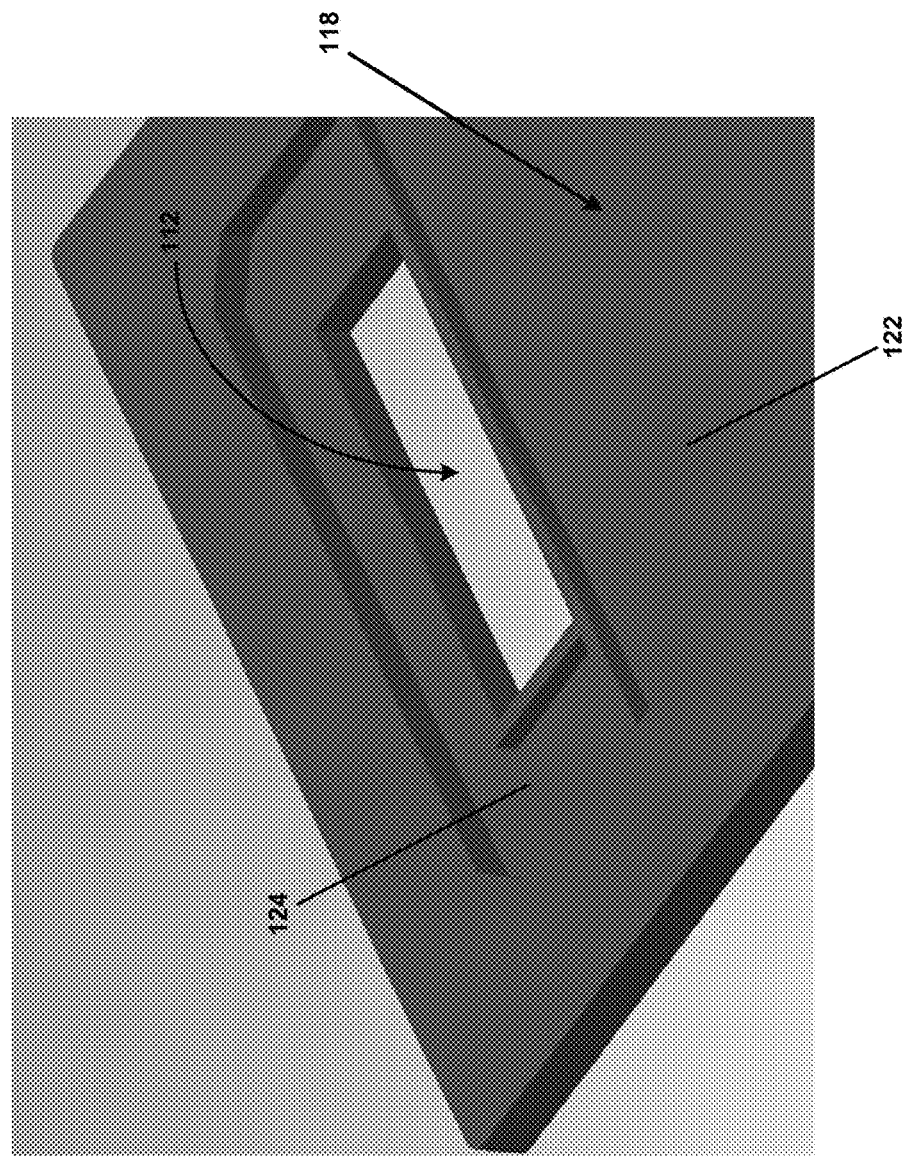
FIG. 4 shows one example of the package of FIG. 1.

FIG. 4 illustrates a first groove 122 and a second groove 124 on lid 110. During fabrication, thermal interface material 120 may deposited to first web groove 122 that is formed within lid 110. For example, first web groove 122 may have the same two-dimensional dimensions as ASCI chip 102, as one non-limiting example, and thermal interface material 120 may be deposited into first web groove 122 to form thermal interface material 120. Thermal interface material 120 may facilitate heat transfer from ASIC chip 102 to lid 110. Moreover, first web groove 122, together with second web groove 124 that may be optionally formed within lid 110, provides increased surface area for thermal interface material 120 to interact with to block or prevent ingress of thermal interface material 120 through to HBM chips 104*a-b*.

First groove 122 and second groove 124, and thermal interface material 120 may be optional, and not necessary in every example. The size, shape, and location of first groove 122 and second groove 124 may be based on the size of ASIC chip 102 or other implementation-specific details.

Figure 5:
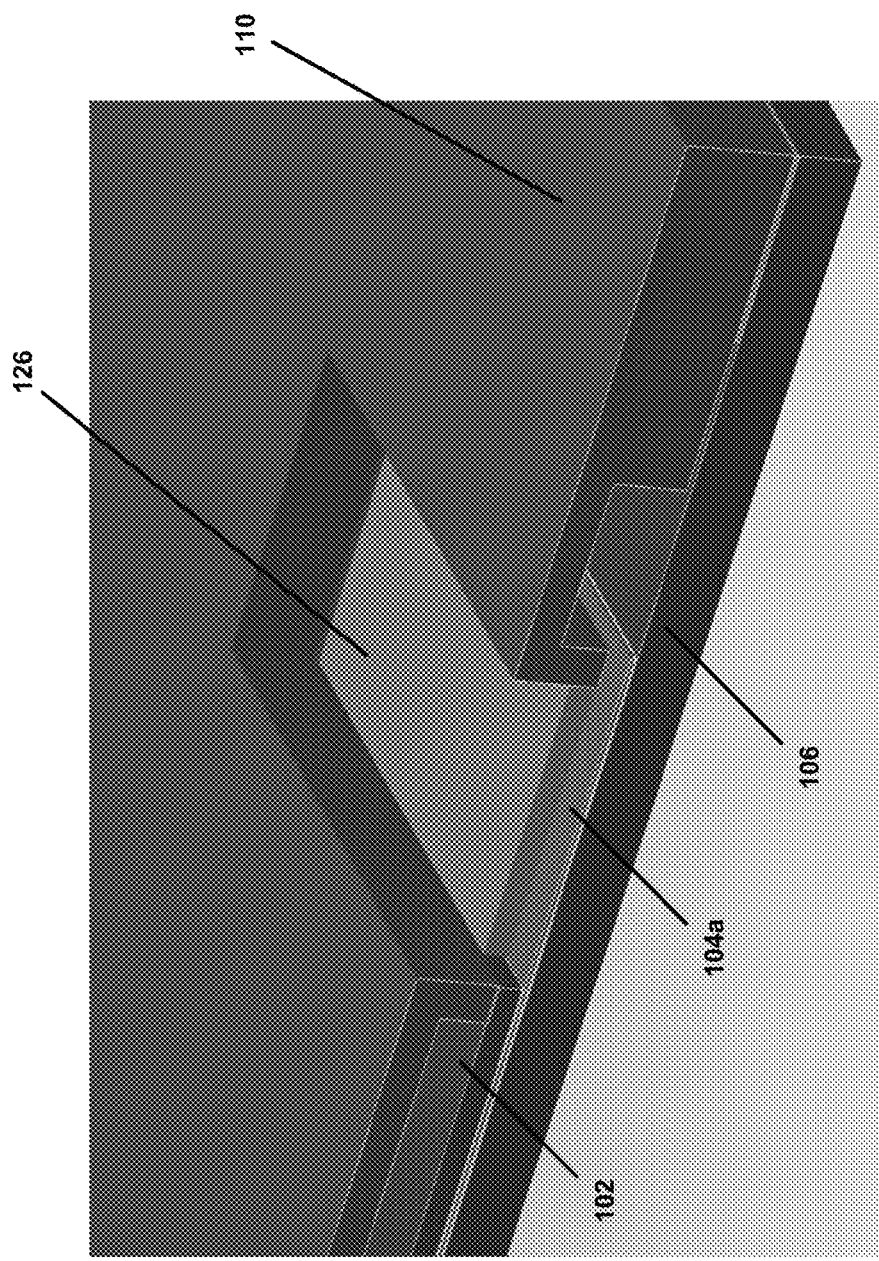
FIG. 5 shows one example of the package of FIG. 1.

Moreover, thermal interface material 120 is one example of thermal interface material. For example, FIG. 5 illustrates thermal interface material 126 that may be optionally deposited to cover the surface of HBM chips 104*a-b* during fabrication. Thermal interface material 126, which may be similar to thermal interface 120, may passivate the surface of HBM chips 104*a-b* and further facilitate heat transfer from HBM chips 104*a-b* to ambient or a dedicated heat sink (not shown).

HBM chips 104*a-b* may be mounted to interposer 106 immediately adjacent to ASIC chip 102. As an example only, linear distance A (see e.g., FIG. 1) between HBM chips 104*a-b* and ASIC chip 102 is about 0.07 mm. Linear distance between HBM chip 104*a* and HBM chip 104*b* may also be about 0.07 mm, although such distances (i.e., pitch) and even the architecture or topology as shown in FIGS. 1-5 and described may be implementation-specific and evolve as technology evolves. For example, the packages illustrated in FIGS. 1-5 are examples of an asymmetric architecture. One example of an asymmetric architecture is asymmetry about both the x-axis and y-axis as illustrated in FIG. 1. The present disclosure however is not so limited.

Figure 6:
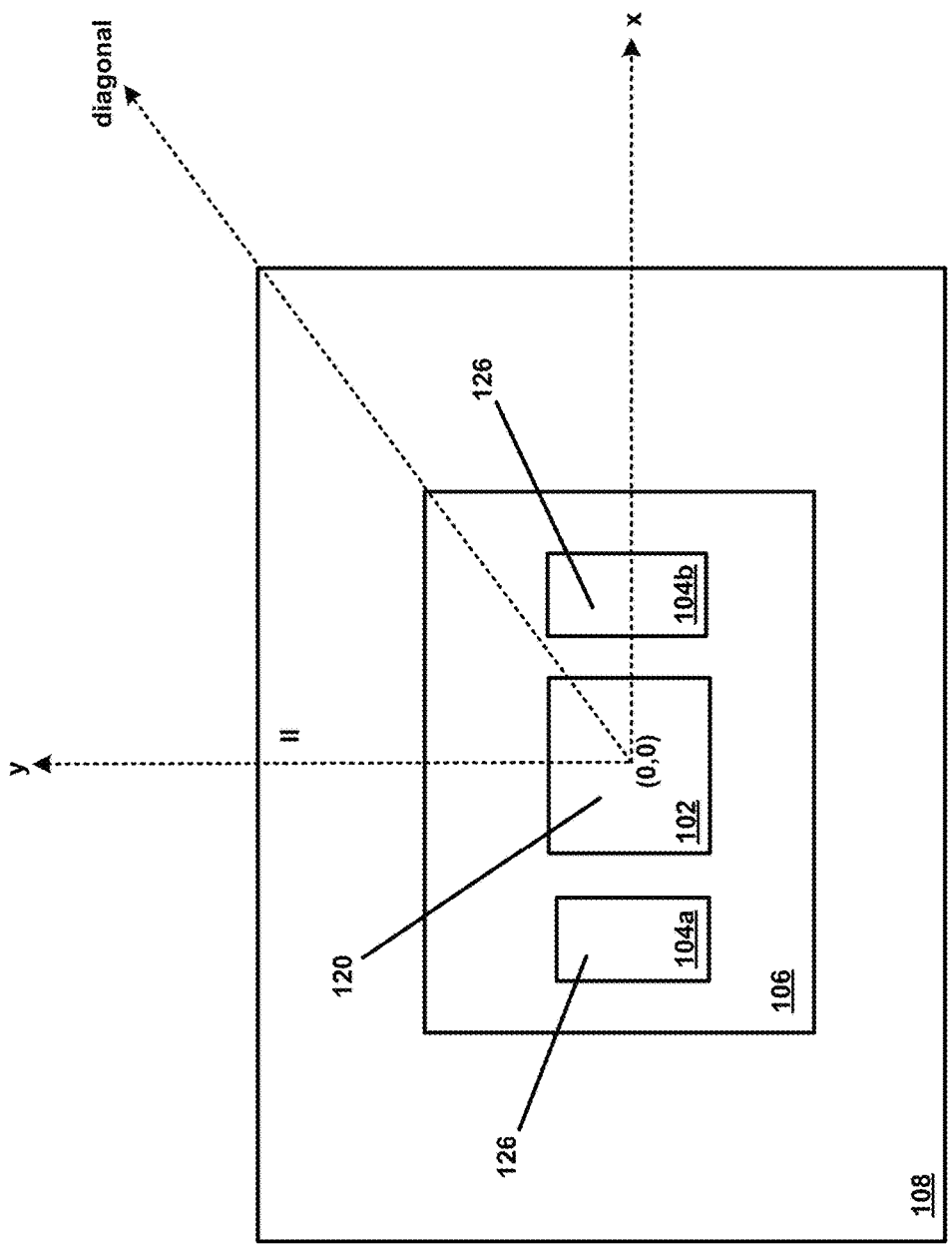
FIG. 6 shows another semiconductor electronic package according to the disclosure.
Figure 7:
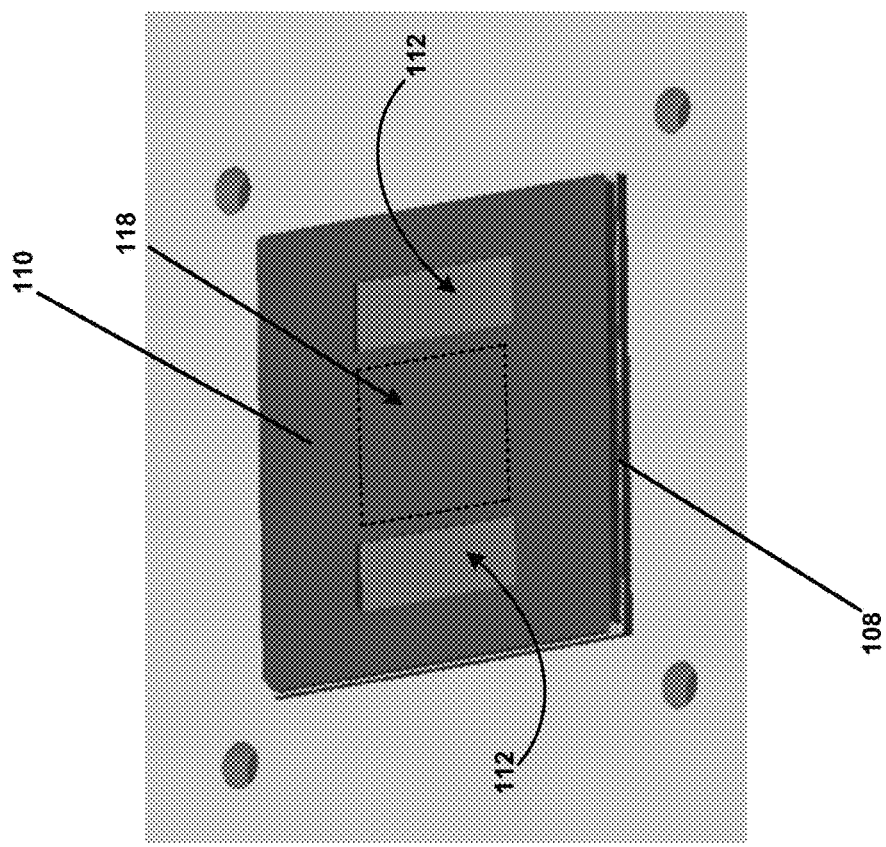
FIG. 7 shows one example of the package of FIG. 6.

For example, FIGS. 6-7 show additional example semiconductor electronic packages according to the disclosure. While package 200 exhibits the same or similar parts as package 100 of FIGS. 1-5, package 200 is an example of a symmetric architecture. One example of a symmetric architecture is symmetry about both the x-axis and y-axis, as illustrated in FIG. 6. As illustrated in FIG. 6, package 200 includes ASIC chip 102 and HBM chips 104*a-b* each mounted to interposer 106, where interposer 106 is mounted to printed circuit board 108. As illustrated in FIG. 7, lid 110 is mounted over interposer 106 to cover ASIC chip 102. Although not shown in FIG. 6 or 7, one or more examples of semiconductor electronic package 200 may include first and second grooves 122, 124, and thermal interface material 120, 126 as described above.

Similar to the examples in FIGS. 1-5, in the examples in FIGS. 6 and 7, lid 110 includes apertures 112 that extend therethrough, where apertures 112 are located on or within lid 110 such that a top surface of each one of HBM chips 104*a-b* is completely exposed through apertures 112 when lid 110 is mounted over interposer 106 to cover ASIC chip 102. Further, when lid 110 is mounted over interposer 106 to cover ASIC chip 102, a top surface of ASIC chip 102 is in close thermal contact with underside surface 118 of lid 110 via thermal interface material 120 that covers the surface of ASIC chip 102 and that during fabrication is deposited to first web groove 122 (see e.g., FIG. 4) formed within lid 110. Thermal interface material 120 facilitates heat transfer from ASIC chip 102 to lid 110, while first web groove 122, together with second web groove 124 (see e.g., FIG. 4) formed around each one aperture 112 of lid 110, provides increased surface area for thermal interface material 120 to interact with to block or prevent ingress of thermal interface material 120 through to HBM chips 104*a-b*. During fabrication, thermal interface material 126 may optionally be deposited to cover the surface of HBM chips 104*a-b*, in order to passivate the surface of HBM chips 104*a-b* and further facilitate heat transfer from HBM chips 104*a-b* to ambient or a dedicated heat sink (not shown).

Regarding lid 110, including aperture(s) 112 as discussed in connection with FIGS. 1-7, such an implementation is beneficial in that HBM chips 104*a-b* are substantially or nearly completely thermally decoupled from ASIC chip 102. This is because lid 110, which for example is formed of a metallic, high thermal conductivity material (e.g., copper, 304 steel, etc.) and serves as a heat spreader for ASIC chip 102, is not in physical contact with HBM chips 104*a-b*. HBM chips 104*a-b* are therefore not directly exposed to heat generated by ASIC chip 102. Instead, and optionally, a dedicated heat sink (not shown) may be coupled directly to lid 110 to dissipate heat generated by ASIC chip 102 away from ASIC chip 102, and a separate, dedicated heat sink (not shown) may be coupled to HBM chips 104*a-b* to dissipate heat generated by HBM chips 104*a-b* away from HBM chips 104*a-b*. Such an implementation may be advantageous because, in general, the thermal or temperature limit for ASIC chip 102 is greater than the thermal or temperature limit for HBM chips 104*a-b* (e.g., 115C verses 95C). If HBM chips 104*a-b* were directly exposed to heat generated by ASIC chip 102 then the thermal or temperature limit for HBM chips 104*a-b* could be exceeded. This may lead to malfunction or failure of HBM chips 104*a-b* over time.

In addition, and as mentioned above, lid 110 may be formed of a metallic, high thermal conductivity material, and may serve as a heat spreader for ASIC chip 102.

However, lid 110 may also serve as a structural stiffener to prevent or at least minimize warpage of package 100 of FIGS. 1-5, as well as package 200 of FIGS. 6-7, when package 100 or package 200 is subjected to temperature variations (e.g., under quality control or in the field). That is, one or more components of package 100 or package 200 (e.g., interposer 106, printed circuit board 108, etc.) may flex or bend under load from temperature-induced expansion/contraction forces, and lid 110 due to its rigidity may serve as a load bearing member to prevent or lessen the extent of damage due to flexing and bending of package 100 or package 200 over time. An example of such flexing and bending is represented by the simulated data of FIGS. 8-10, where it has been found that aperture(s) 112 of lid 110 does or do not interfere with the ability of lid 110 to serve as a structural stiffener to prevent or at least minimize warpage of package 100 or package 200.

Figure 8:
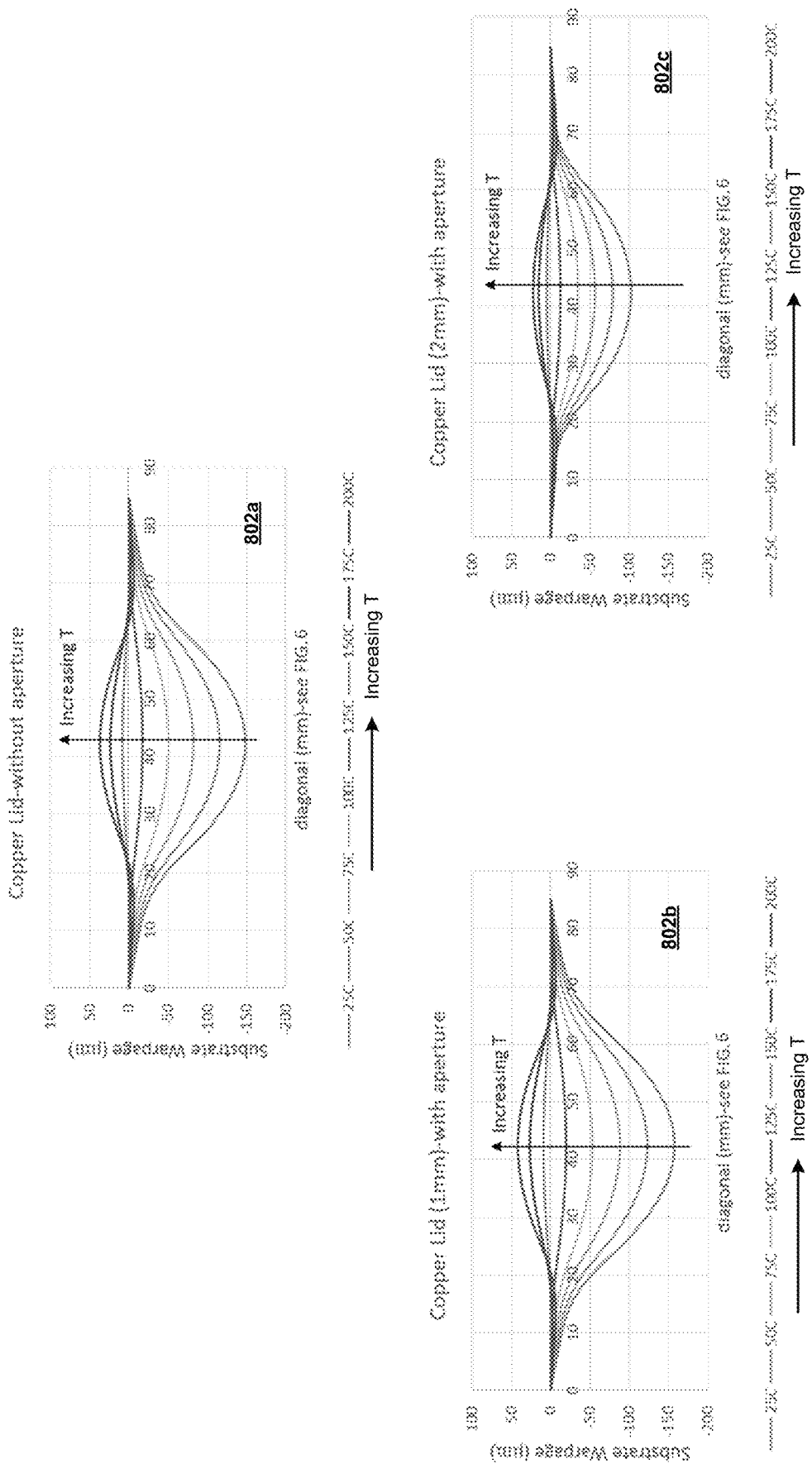
FIG. 8 shows a first set of substrate warpage plots according to the disclosure.

For example, FIG. 8 shows a first set of substrate warpage plots according to the disclosure. Plot 802a of FIG. 8 in particular shows warpage of printed circuit board 108 of package 200 of FIGS. 6-7, as package 200 is subjected to simulated load from temperature-induced expansion/contraction forces over a range of temperatures, on condition however that apertures 112 are wholly omitted from lid 110 and lid 110 itself is formed of 1 mm thick copper. Thus, plot 802a represents a baseline simulation, where the ordinate for plot 802a represents "Substrate Warpage (μm)" and the abscissa represents "diagonal (mm)" or a particular location along the diagonal axis that extends into quadrant II of the x-y plot as shown in FIG. 6. Regarding the diagonal axis, "diagonal=0" as shown in plot 802a for example corresponds to the origin (0,0) of the x-y plot as shown in FIG. 6, and "diagonal=50 mm" as shown in plot 802a corresponds to a particular location that is measured as 50 mm from the origin (0,0) of the x-y plot as shown in FIG. 6 along the axis that extends into quadrant II. In general, printed circuit board 108 exhibits negative (e.g., about −150 μm) to positive (e.g., about +30 μm) maximum deflections over the range of temperatures as shown in plot 802a. Such deflections if too excessive or frequent may cause malfunction or failure of one or more components of package 200.

Plots 802b-c (same ordinate/abscissa as plot 802a) on the other hand show warpage of printed circuit board 108 of package 200 of FIGS. 6-7, as package 200 is subjected to simulated load from temperature-induced expansion/contraction forces over a range of temperatures, on condition however that apertures 112 are formed within lid 110, as shown in FIGS. 6-7, and lid 110 is formed of 1 mm thick and 2 mm thick copper, respectively. As expected, with only a change in metal thickness (of lid 110), maximum warpage of printed circuit board 108 under load as described for the condition that lid 110 is formed 2 mm thick copper is less than warpage of printed circuit board 108 under load as described for the condition that lid 110 is formed 1 mm thick copper, over the entire range of temperatures. It is unexpected, however, that warpage of printed circuit board 108 under load as described for the condition that lid 110 is formed 1 mm thick copper with apertures 120 is about the same (compare plot 802a with plot 802b) as warpage of printed circuit board 108 under load as described for the condition that lid 110 is formed 1 mm thick copper without apertures 112. In this way it has been found that aperture(s) 112 of lid 110 does or do not interfere with the ability of lid 110 to serve as a structural stiffener to prevent or at least minimize warpage of package 100 of FIGS. 1-5, as well as package 200 of FIGS. 6-7.

Figure 9:
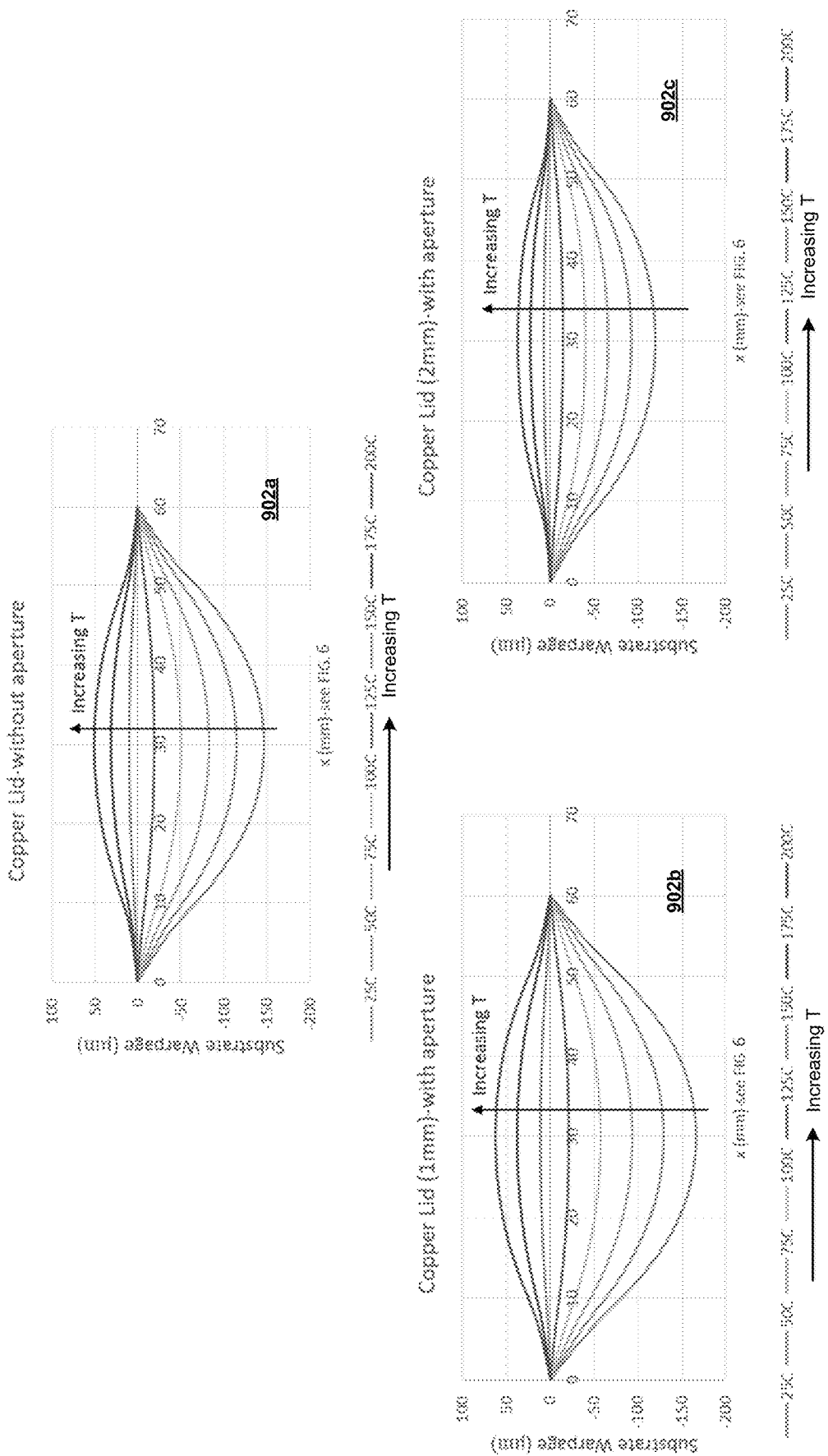
FIG. 9 shows a second set of substrate warpage plots according to the disclosure.

As another example, FIG. 9 shows a second set of substrate warpage plots according to the disclosure. Plot 902a of FIG. 9 in particular shows warpage of printed circuit board 108 of package 200 of FIGS. 6-7, as package 200 is subjected to simulated load from temperature-induced expansion/contraction forces over a range of temperatures, on condition however that apertures 112 are wholly omitted from lid 110 and lid 110 itself is formed of 1 mm thick copper. Thus, plot 902a represents a baseline simulation, where the ordinate for plot 902a represents "Substrate Warpage (μm)" and the abscissa represents "x (mm)" or a particular location along the x-axis of the x-y plot as shown in FIG. 6. Regarding the abscissa, "x=0" as shown in plot 902a for example corresponds to the origin (0,0) of the x-y plot as shown in FIG. 6, and "x=30 mm" as shown in plot 902a corresponds to a particular location that is measured as 30 mm from the origin (0,0) of the x-y plot as shown in FIG. 6 along the x-axis. In general, printed circuit board 108 exhibits negative (e.g., about −150 μm) to positive (e.g., about +50 μm) maximum deflections over the range of temperatures as shown in plot 902a.

Plots 902b-c (same ordinate/abscissa as plot 902a) on the other hand show warpage of printed circuit board 108 of package 200 of FIGS. 6-7, as package 200 is subjected to simulated load from temperature-induced expansion/contraction forces over a range of temperatures, on condition however that apertures 120 are formed within lid 110, as shown in FIGS. 6-7, and lid 110 is formed of 1 mm thick and 2 mm thick copper, respectively. As expected, maximum warpage of printed circuit board 108 under load as described for the condition that lid 110 is formed 2 mm thick copper is less than warpage of printed circuit board 108 under load as described for the condition that lid 110 is formed 1 mm thick copper, over the entire range of temperatures. Similar to the results shown in FIG. 8, however, it is unexpected that warpage of printed circuit board 108 under load as described for the condition that lid 110 is formed 1 mm thick copper with apertures 120 is about the same (compare plot 902a with plot 902b) as warpage of printed circuit board 108 under load as described for the condition that lid 110 is formed 1 mm thick copper without apertures 112. In this way it has been found that aperture(s) 112 of lid 110 does or do not interfere with the ability of lid 110 to serve as a structural stiffener to prevent or at least minimize warpage of package 100 of FIGS. 1-5, as well as package 200 of FIGS. 6-7.

Figure 10:
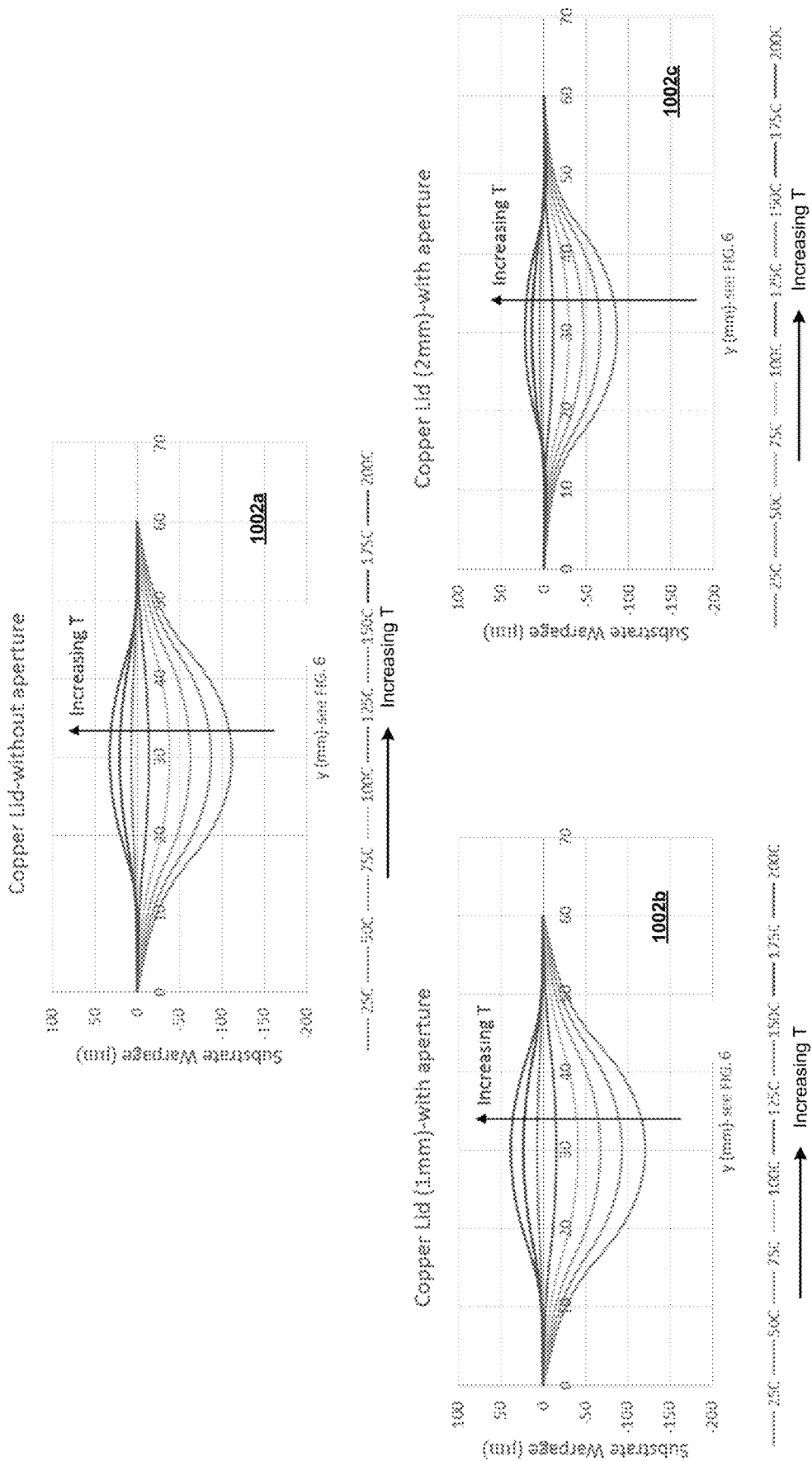
FIG. 10 shows a third set of substrate warpage plots according to the disclosure.

As yet another example, FIG. 10 shows a third set of substrate warpage plots according to the disclosure. Plot 1002a of FIG. 10 in particular shows warpage of printed circuit board 108 of package 200 of FIGS. 6-7, as package 200 is subjected to simulated load from temperature-induced expansion/contraction forces over a range of temperatures, on condition however that apertures 112 are wholly omitted from lid 110 and lid 110 itself is formed of 1 mm thick copper. Thus, plot 1002a represents a baseline simulation, where the ordinate for plot 1002a represents "Substrate Warpage (μm)" and the abscissa represents "y (mm)" or a particular location along the y-axis of the x-y plot as shown in FIG. 6. Regarding the abscissa, "y=0" as shown in plot 1002a for example corresponds to the origin (0,0) of the x-y plot as shown in FIG. 6, and "y=30 mm" as shown in plot 1002a corresponds to a particular location that is measured as 30 mm from the origin (0,0) of the x-y plot as shown in FIG. 6 along the y-axis. In general, printed circuit board 108 exhibits negative (e.g., about −110 μm) to positive (e.g., about +30 μm) maximum deflections over the range of temperatures as shown in plot 1002a.

Plots 1002*b-c* (same ordinate/abscissa as plot 1002*a*) on the other hand show warpage of printed circuit board 108 of package 200 of FIGS. 6-7, as package 200 is subjected to simulated load from temperature-induced expansion/contraction forces over a range of temperatures, on condition however that apertures 112 are formed within lid 110, as shown in FIGS. 6-7, and lid 110 is formed of 1 mm thick and 2 mm thick copper, respectively. As expected, maximum warpage of printed circuit board 108 under load as described for the condition that lid 110 is formed 2 mm thick copper is less than warpage of printed circuit board 108 under load as described for the condition that lid 110 is formed 1 mm thick copper, over the entire range of temperatures. Similar to the results shown in FIG. 9, however, it is unexpected that warpage of printed circuit board 108 under load as described for the condition that lid 110 is formed 1 mm thick copper with apertures 112 is about the same (compare plot 1002*a* with plot 1002*b*) as warpage of printed circuit board 108 under load as described for the condition that lid 110 is formed 1 mm thick copper without apertures 223. In this way it has been found that aperture(s) 112 of lid 110 does or do not interfere with the ability of lid 110 to serve as a structural stiffener to prevent or at least minimize warpage of package 100 of FIGS. 1-5, as well as package 200 of FIGS. 6-7.

Figure 11:
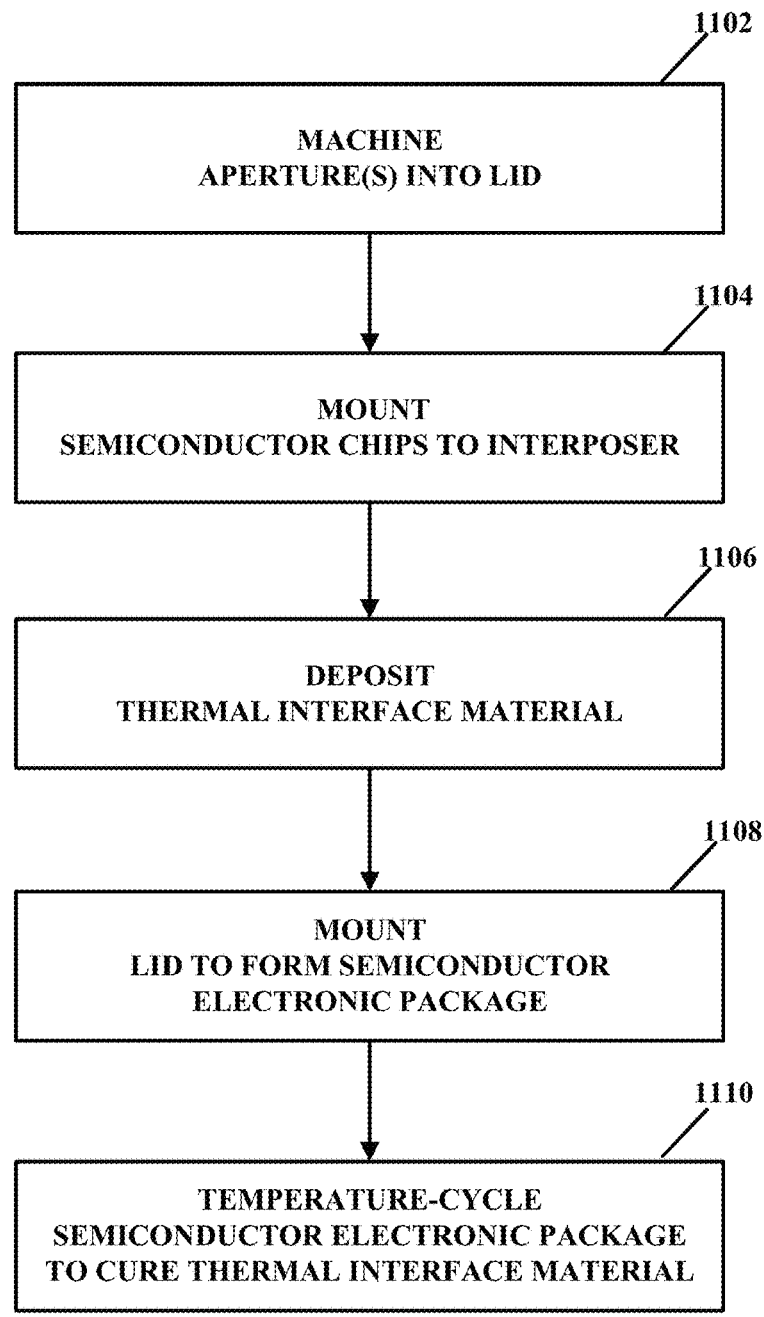
FIG. 11 shows a method for fabricating a semiconductor electronic package according to the disclosure.

Referring now to FIG. 11, a method 1100 for fabricating a semiconductor electronic package is shown according to the disclosure. In this example, and with reference to package 100 and package 200 as discussed above in connection with FIGS. 1-7, method 1100 includes a step of machining (1102) aperture(s) 112 into lid 110. In general, aperture(s) 112 is machined into lid 110 to exhibit a cross-sectional area that is less than or equal to a footprint of ASIC chip 102 as mounted to interposer 106, or a cross-sectional area that is greater than or equal to a footprint of one or both HBM chips 104*a-b* as mounted to interposer 106. Such an implementation is consistent that as illustrated in FIGS. 1-2 and FIGS. 6-7, for example, where relative dimensions are represented accurately and as such the cross-sectional area dimension of aperture(s) 112 may in general be graphically compared against the area either ASIC chip 102, represented by underside surface 118, or the area one or both of HBM chips 104*a-b*, is depicted to occupy on interposer 106. Advantageously, size and placement of aperture(s) 112 within lid 110 as contemplated throughout does or do not interfere with the ability of lid 110 to serve as a structural stiffener to prevent or at least minimize warpage of package 100 or package 200.

Method 1100 further includes a step of mounting (1104) ASIC chip 102 and HBM chips 104*a-b* to interposer 106 and a step of depositing (1106) thermal interface material 120 to first web groove 122 formed within lid 110. Method 1100 further includes a step of mounting (1108) lid 110 such that the surface of ASIC chip 102 is in close thermal contact with underside surface 118 of lid 110 via thermal interface material 120, and such that the surface of each one of HBM chips 104*a-b* is completely exposed through aperture 112, and also a step of temperature-cycling (1100) package 100 or package 200 to cure thermal interface material 120. Optionally, and not shown in FIG. 11, method 1100 may further include a step of depositing thermal interface material 126 to cover the surface of HBM chips 104*a-b*, in order to passivate the surface of HBM chips 104*a-b* and further facilitate heat transfer from HBM chips 104*a-b* to ambient or a dedicated heat sink, and a step of temperature-cycling package 100 or package 200 to cure thermal interface material 126. The example method 1100 may include other steps or actions, and the order of the steps or actions of the example method 1100 is not fixed and may in general be defined according to implementation-specific details and requirements.

As described and illustrated, the present disclosure is directed to techniques for thermally decoupling discrete semiconductor chips that are mounted to a substrate of a semiconductor electronic package, while structural integrity of the semiconductor electronic package is simultaneously maintained or maximized. In general, such techniques may be implemented or realized as any one of a semiconductor electronic package or a method for fabricating a semiconductor electronic package such as shown in FIG. 11.

As an example, a semiconductor electronic package may include or comprise a substrate, a first electronic component that is of a first type and that is mounted along a surface of the substrate, a second electronic component that is of a second type different than the first type and that is mounted along the surface of the substrate, and a metallic component that is positioned over the first electronic component and that has an aperture through which the second electronic component is exposed. Such an implementation is consistent with the package 100 of FIGS. 1-5, as well as package 200 of FIGS. 6-7, where the substrate may correspond to a silicon interposer (e.g., interposer 106), the first electronic component may correspond to an integrated circuit die (e.g., ASIC chip 102), the second electronic component may correspond a non-transitory memory element (e.g., HBM chip 104*a/b*), and the metallic component may correspond to a lid (e.g., lid 110) that in practice is configured as a heat sink for the first electronic component which may have a thermal operating limit greater than the second electronic component. In addition, in some examples, the first electronic component may be coupled along the surface of the substrate immediately adjacent to the second electronic component, to the extent possible as permitted by design rules and processing technology. As such, read/write operations for example may be performed at speeds that approach theoretical limits.

In addition, or as an alternative, the semiconductor electronic package may include or comprise at least one of a thermal interface material positioned between and in contact with the metallic component and the first electronic component and a thermal interface material positioned over a surface of the second electronic component and exposed though the aperture. Such an implementation is consistent with thermal interface material 120 and thermal interface material 126, respectively, and in practice thermal interface material 120 and thermal interface material 126 may correspond to a heat conductive grease or adhesive, a phase change material, or a graphite or any other material that would facilitate heat transfer.

In addition, or as an alternative, the aperture has a cross-sectional area that is greater than or equal to a footprint of the second electronic component on the substrate, or has a cross-sectional area that is less than or equal to a footprint of the first electronic component on the substrate. Such an implementation is consistent that as illustrated in FIGS. 1-2 and FIGS. 6-7, for example, where relative dimensions are represented accurately and as such the cross-sectional area dimension of aperture(s) 112 may in general be graphically compared against the area either ASIC chip 102, represented by underside surface 118, or the area one or both of HBM chips 104*a-b*, is depicted to occupy on interposer 106.

Advantageously, size and placement of aperture(s) 112 within lid 110 as contemplated throughout does or do not interfere with the ability of lid 110 to serve as a structural stiffener to prevent or at least minimize warpage of package 100 or package 200. Instead, lid 110 allows to control warpage of package 100 or package 200, both during fabrication of package 100 or package 200 and under heat sink mechanical pressure. Further, with such an implementation as contemplated, existing designs may be leveraged and may enable for simplification of an existing heat sink which could rely on the higher pressure in the thermal joint, while giving an option of establishing the floating contact with the under-lid HBM areas. Further, while ASIC chip 102 and HBM chips 104*a-b* are illustrated as discrete chips mounted on or to interposer 106, ASIC chip 102 and HBM chips 104*a-b* in another example may be realized as discrete chips each mounted to a different instance of interposer 106. In another example, ASIC chip 102 and HBM chips 104*a-b* may be realized as discrete circuitry or chips each mounted to a semiconductor die that in turn is mounted on or to an interposer. Other architectures or topologies are relevant as well, such as for example in a three-dimensional package implementation, also sometimes referred to as a "2.5d" package or assembly.

Various aspects of the present disclosure have been described. Such and other aspects are within the scope of the following claims.

What is claimed is:

1. A semiconductor electronic package, comprising:
  a substrate;
  a first electronic component that is of a first type and that is mounted along a surface of the substrate;
  a plurality of second electronic components that are of a second type different than the first type, wherein the plurality of second electronic components are mounted along the surface of the substrate and are spaced apart along the surface of the substrate from the first electronic component;
  a metallic component that is positioned over the first electronic component and that has an aperture through which the plurality of second electronic components are exposed;
  a first heat sink coupled to the metallic component to dissipate heat generated by the first electronic component away from the first electronic component; and
  a second heat sink, mechanically and thermally separate from both the first heat sink and the metallic component, coupled to the plurality of second electronic components to dissipate heat generated by the plurality of second electronic components away from the plurality of second electronic components.

2. The semiconductor electronic package of claim 1, wherein the substrate comprises a silicon interposer.

3. The semiconductor electronic package of claim 1, wherein the first electronic component comprises at least one integrated circuit die.

4. The semiconductor electronic package of claim 1, wherein each one of the plurality of second electronic components comprises at least one memory element.

5. The semiconductor electronic package of claim 1, wherein the metallic component comprises a lid.

6. The semiconductor electronic package of claim 1, wherein the first electronic component has a thermal operating limit greater than the plurality of second electronic components.

7. The semiconductor electronic package of claim 1, further comprising a thermal interface material positioned between and in contact with the metallic component and the first electronic component.

8. The semiconductor electronic package of claim 1, further comprising a thermal interface material positioned over a surface of each one the plurality of second electronic components.

9. The semiconductor electronic package of claim 1, wherein the metallic component is configured to prevent a bending of the semiconductor electronic package and to serve as a heat spreader for the first electronic component.

10. A method, comprising:
  mounting a metallic component to a semiconductor electronic package, the semiconductor electronic package including a first electronic component and a plurality of second electronic components that are of a type different than the first electronic component, wherein the first electronic component is covered by the metallic component, wherein the first electronic component and the plurality of second electronic components are mounted along a surface of a substrate of the semiconductor electronic package, wherein the first electronic component is spaced apart along the surface of the substrate from the plurality of second electronic components, and wherein the plurality of second electronic components are exposed through an aperture of the metallic component;
  coupling a first heat sink to the metallic component to dissipate heat generated by the first electronic component away from the first electronic component; and
  coupling a second heat sink, mechanically and thermally separate from both the first heat sink and the metallic component, to the plurality of second electronic components to dissipate heat generated by the plurality of second electronic components away from the plurality of second electronic components.

11. The method of claim 10, wherein the substrate comprises a silicon interposer.

12. The method of claim 10, wherein the first electronic component comprises at least one integrated circuit die.

13. The method of claim 10, wherein each one of the plurality of second electronic components comprises at least one memory element.

14. The method of claim 10, wherein the metallic component comprises a lid.

15. The method of claim 10, wherein the first electronic component has a thermal operating limit greater than the plurality of second electronic components.

16. The method of claim 10, further comprising depositing a thermal interface material on a surface of the first electronic component such that the thermal interface material is positioned between and in contact with the metallic component and the first electronic component after mounting the metallic component to the semiconductor electronic package.

17. The method of claim 10, further comprising depositing a thermal interface material over a surface of each one of the plurality of second electronic components such that the thermal interface material is positioned between and in contact with the second heat sink and the plurality of second electronic components after coupling the second heat sink to the plurality of second electronic components.

18. A semiconductor electronic package, comprising:
  a first electronic component that is of a first type;
  a plurality of second electronic components that are of a second type different than the first type, wherein the plurality of second electronic components are mounted along a surface of a substrate and are spaced apart along the surface of the substrate from the first electronic component;

a metallic component that is positioned over the first electronic component and that has an aperture through which the plurality of second electronic components are exposed;

a first heat sink coupled to the metallic component to dissipate heat generated by the first electronic component away from the first electronic component; and a second heat sink, mechanically and thermally separate from both the first heat sink and the metallic component, coupled to the plurality of second electronic components to dissipate heat generated by the plurality of second electronic components away from the plurality of second electronic components.

19. The semiconductor electronic package of claim 18, wherein the first electronic component comprises at least one integrated circuit die.

20. The semiconductor electronic package of claim 18, wherein each one of the plurality of second electronic components comprises at least one memory element.

\* \* \* \* \*